United States Patent
Ohkita et al.

(10) Patent No.: US 6,478,637 B1
(45) Date of Patent: Nov. 12, 2002

(54) CONTACT FOR CPU SOCKET

(75) Inventors: Masao Ohkita, Tu-Chen (TW); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/036,282

(22) Filed: Dec. 24, 2001

(51) Int. Cl.⁷ .................................................. H01R 13/11
(52) U.S. Cl. ...................................... 439/857; 439/342
(58) Field of Search ................................ 439/857, 342, 439/856

(56) References Cited

U.S. PATENT DOCUMENTS

| | | | | |
|---|---|---|---|---|
| 4,498,725 A | * | 2/1985 | Bright et al. | 439/342 |
| 5,092,789 A | * | 3/1992 | Sinclair | 439/342 |
| 6,142,810 A | * | 11/2000 | Hsiao et al. | 439/857 |
| 6,267,615 B1 | * | 2/2001 | Lin | 439/342 |
| 6,319,038 B1 | * | 11/2001 | Howell et al. | 439/342 |

* cited by examiner

*Primary Examiner*—Gary Paumen
(74) *Attorney, Agent, or Firm*—Wei Te Chung

(57) ABSTRACT

A contact comprises a base (20) and a pair of arm sections (30). The base has a body section (21) adapted for being secured in a socket connector housing. The body section comprises a linking section (22) downwardly extending from a bottom edge. A soldering section (23) extends perpendicularly from a bottom edge of the linking section. The body section of the base defines a rectangular window (211) dividing the body section into an upper section (212) and a lower portion (213). An engaging portion (214) extends from a lower edge of the upper portion of the body section to the window and opposite to the arm sections. The pair of arm sections extends from opposite lateral sides of the base and each comprises a planar clamp (31) at an upper end thereof. A palm (32) extends outwardly from a front end of the clamp toward the engaging portion.

1 Claim, 6 Drawing Sheets

CONTACT FOR CPU SOCKET

BACKGROUND OF THE INVENTION

1. Field of the Invention

The present invention generally relates to a contact for an electrical connector, and particularly to a contact for a Central Processing Unit (CPU) socket connector.

2. Description of Related Art

U.S. Pat. No. 6,267,615 discloses a conventional contact for a CPU socket connector. As is shown in FIG. 4A, the contact 5 comprises a base 50 and a pair of arm sections 60 connected to the base 50. The base 50 includes a body section 51, a head section 52 extending upwardly from the body section 51, and a soldering section 53 extending perpendicularly from a bottom edge of the body section 51. A pair of upper projections 521 and a pair of lower projections 511 are respectively formed on opposite lateral edges of a top portion of the head portion 52 and a bottom portion of the body section 51. The upper and lower projections 521, 511 interferentially secure the contact 5 in the CPU socket connector.

Each arm section 60 includes an upper arm 61 extending forwardly from opposite sides of the body section 51 to the soldering portion 53, an elbow 62 at a bottom portion of the upper arm 61, a forearm 63 extending upwardly from the elbow 62, a substantially planar clamp 64 at a top portion of the forearm 63, and a palm 65 extending from a distal end of the clamp 64 toward the body section 51. The two palms 65 and the body section 51 together define a free space 7 therebetween. The two clamps 64 define a clamping space 641 therebetween for clamping a pin 8 (see FIG. 4B) of the CPU socket connector.

Referring to FIG. 4B, the pin 8 is vertically inserted into the free space 7 and moved in direction A to the clamping space 641. The direction A is perpendicular to the interferential direction of the upper and lower projections 521, 511 with the CPU socket connector, whereby the contact 5 can not be retained in the CPU socket connector securely and may move with the pin 8.

Referring to FIG. 5, the arm section 60 of the contact 5 is formed by a metal strip 60' at each side of a base strip 50' of a carrier strip. The pitch between two contacts 5' on the carrier strip is large, normally three times that of adjacent contact holes defined in the CPU socket connector. This adversely affects the efficiency of punching and assembling because one row of contact holes of the CPU socket connector must be filled up with contacts three times.

Furthermore, the contact portion (the clamp 64') should be gilded for improving the conductive characteristic. Because the carrier 90 and the clamp 64' are arranged on the same side, both of them will be immersed in electrolyte solution and the waste of aurum is great.

SUMMARY OF THE INVENTION

An object of the present invention is to provide a contact securely retained in a contact hole of a CPU socket connector.

Another object of the present invention is to provide a contact which can be efficiently inserted into the contact hole of the CPU socket connector.

A further object of the present invention is to provide a contact during gilding of which the wastage of aurum is reduced.

To fulfill the above mentioned objects, a contact for a socket connector in accordance with the present invention comprises a base and a pair of arm sections. The base has a body section adapted for being secured in the socket connector. The body section has an engaging portion extending therefrom. The pair of arm sections extends from opposite lateral sides of the base in a direction opposite to the engaging portion. The arm sections have a pair of respective planar clamps at upper ends thereof and a pair of respective palms extending from the planar clamps toward the engaging portion and away from each other.

Other objects, advantages and novel features of the invention will become more apparent from the following detailed description of the present embodiment when taken in conjunction with the accompanying drawings.

DETAILED DESCRIPTION OF THE INVENTION

Figure 1:
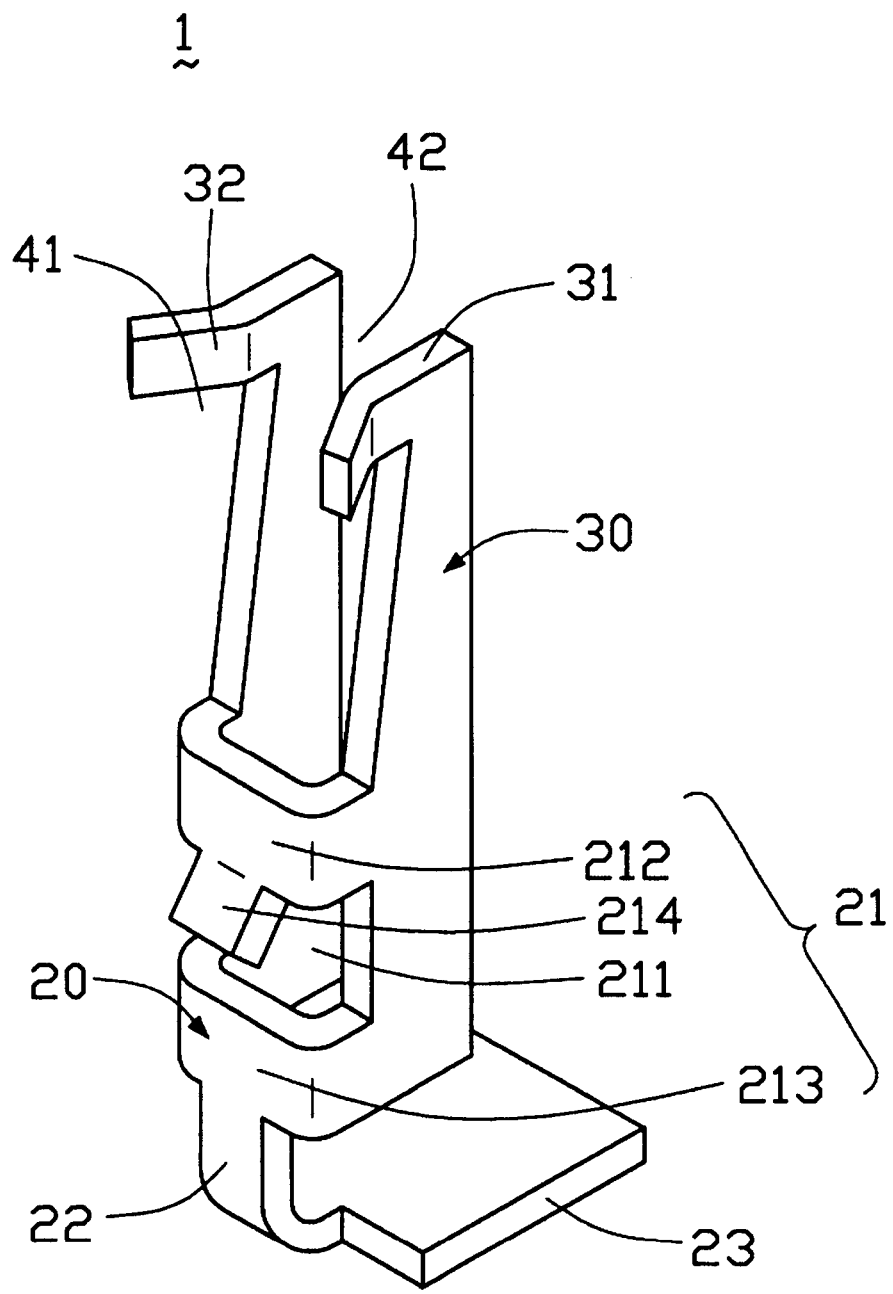
FIG. 1 is a perspective view of a contact in accordance with the present invention.

Referring to FIG. 1, a contact 1 for a CPU socket connector (not shown) in accordance with the present invention comprises a base 20 and a pair of arm sections 30 on opposite lateral sides of the base 20.

The base 20 comprises a body section 21, a linking section 22 downwardly extending from a bottom edge of the body section 21 and a soldering section 23 extending perpendicularly from a bottom edge of the linking section 22. The body section 21 defines a rectangular window 211 at a middle part thereof. The window 211 divides the body section 21 into an upper portion 212 and a lower portion 213. An engaging portion 214 obliquely extends from a lower edge of the upper portion 212 to the window 211 and opposite to the arm sections 30.

Each arm section 30 comprises a planar clamp 31 at an upper end and a palm 32 outwardly extending from a front end of the clamp 31. The palms 32 and a sidewall of a pin hole of the CPU socket connector (not shown) define a free space 41. The two clamps 31 define a clamping space 42 therebetween.

Figure 2:
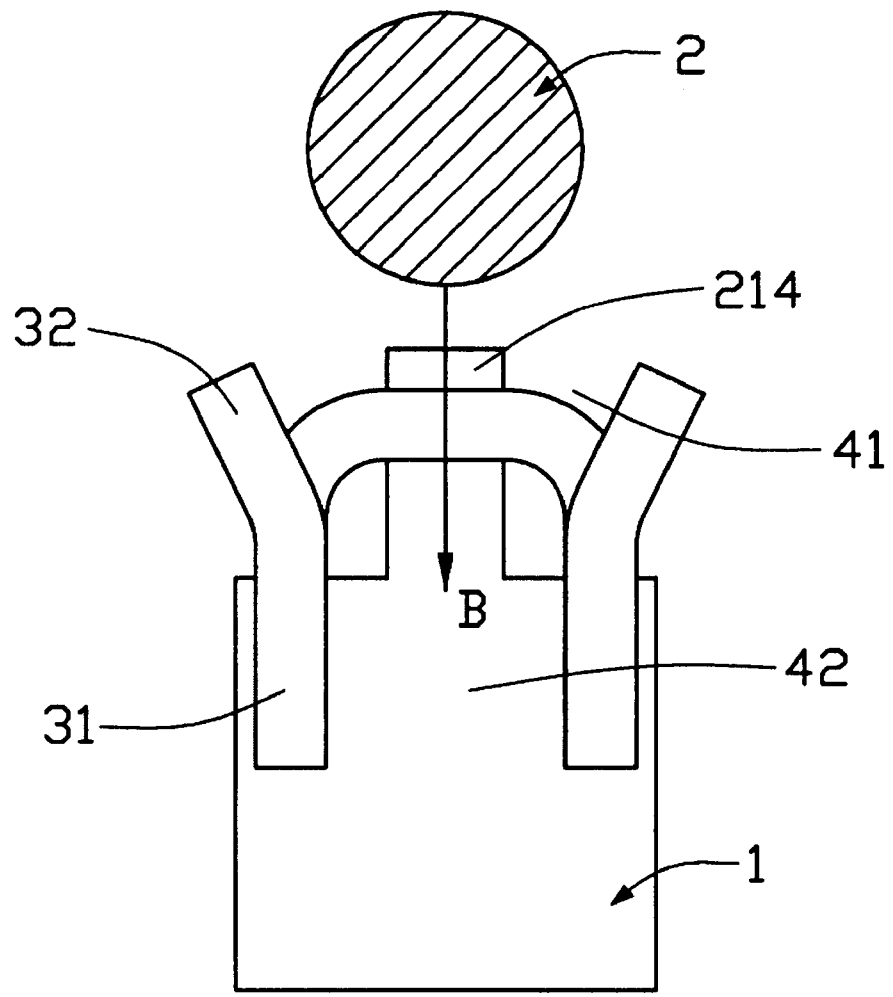
FIG. 2 is a top view of the contact in accordance with the present invention and a pin of a CPU.

Referring to FIG. 2, the contact 1 is retained in the CPU socket connector by the engaging portion 214 interferentially engaging with a sidewall of corresponding pin hole of the socket connector and a side opposite to the engaging portion 214 of the body section 21 abuts on an opposite sidewall of the pin hole. A pin 2 of a CPU is first inserted into the free space 41 and moves in the direction B to the clamping space 42. The moving direction B of the pin 2 is the same as the interferential direction of the engaging portion 214 with the socket connector, whereby the contact 1 will not move with the pin 2 of the CPU.

Figure 3:
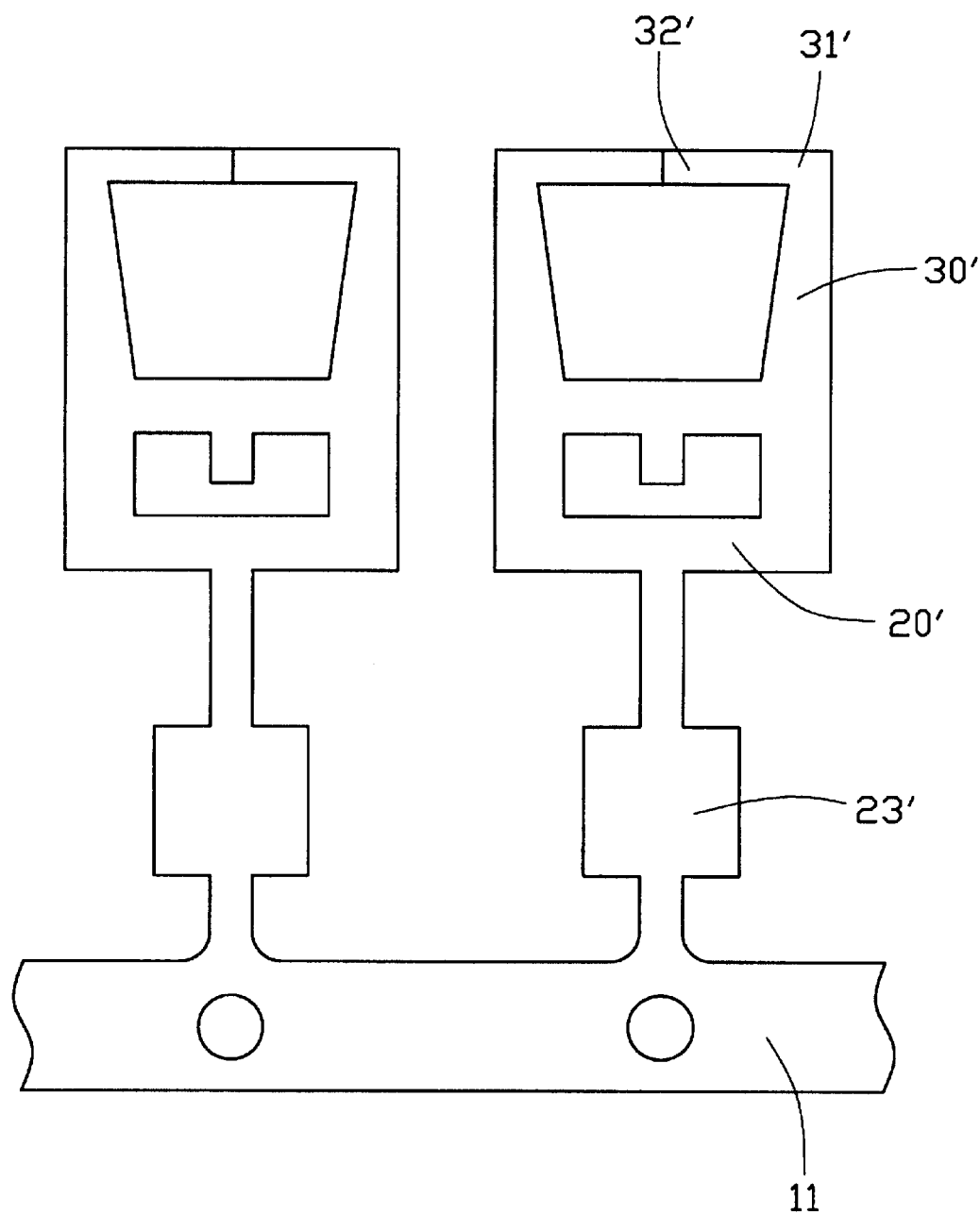
FIG. 3 is a plan view of two contacts in accordance with the present invention connected with a carrier.
Figure 4A:
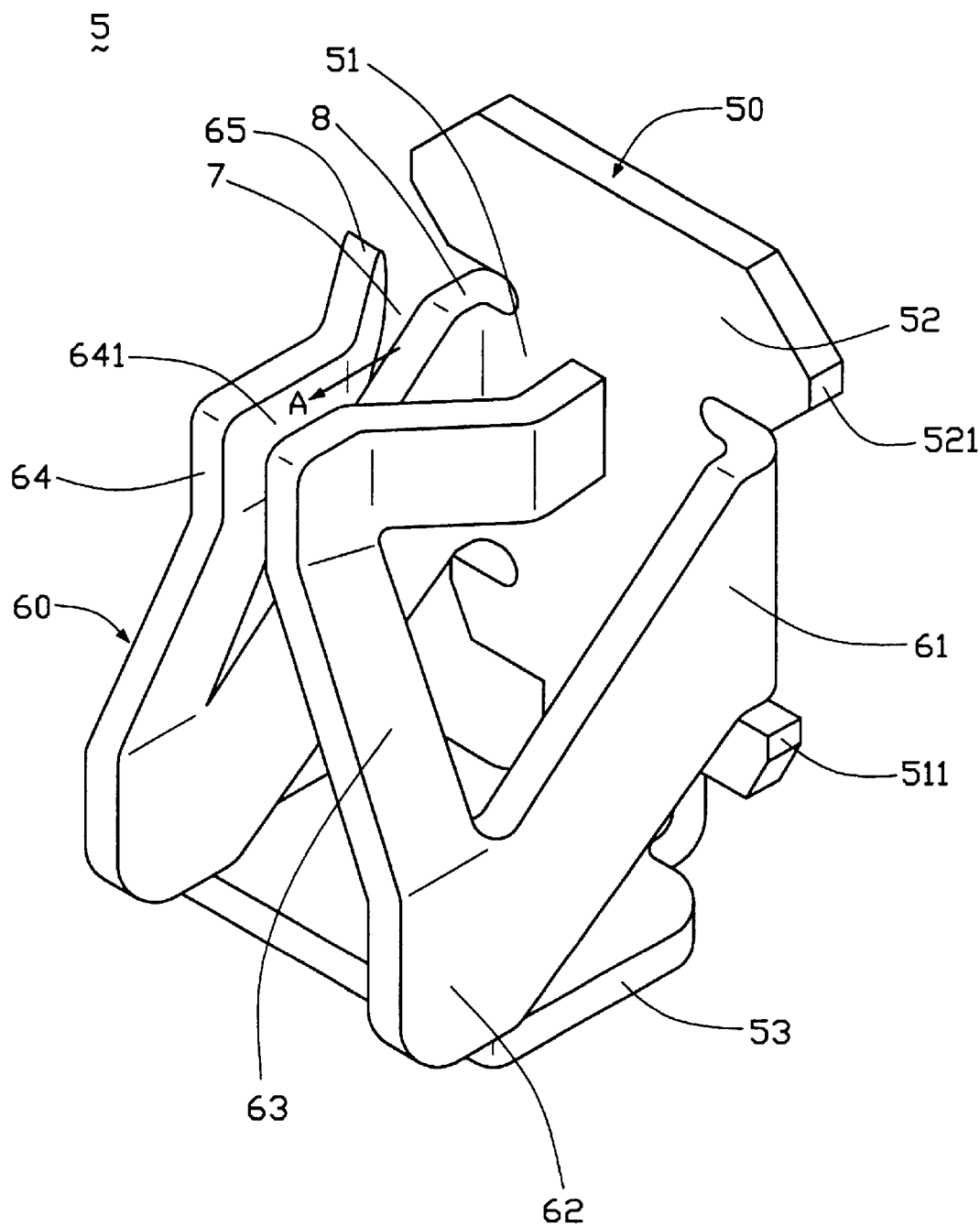
FIG. 4A is a perspective view of a conventional contact.
Figure 4B:
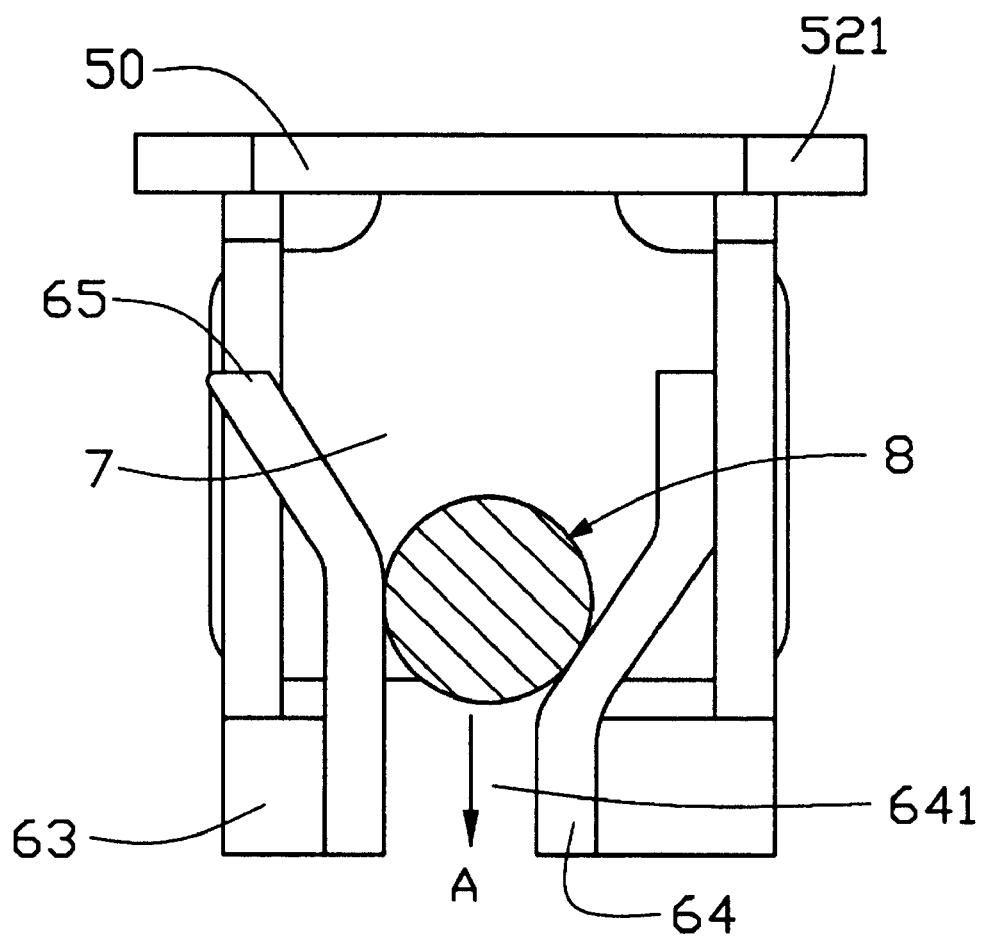
FIG. 4B is a top view of the conventional contact of FIG. 4A engaged with a pin of a CPU.
Figure 5:
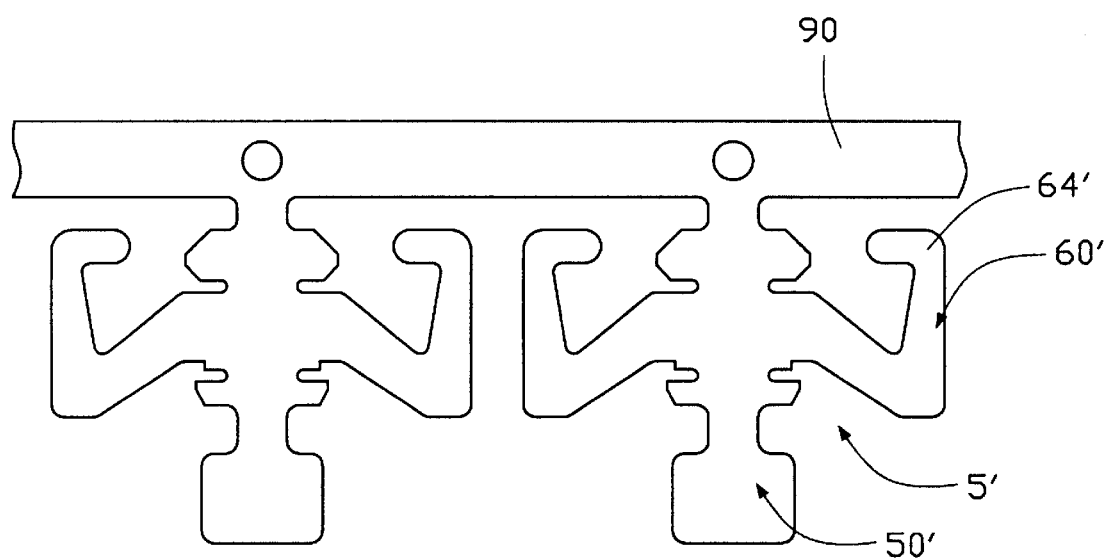
FIG. 5 is a plan view of two conventional contacts of FIG. 4A connected with a carrier.

Referring to FIG. 3, the pitch between two adjacent contacts in accordance with the present invention is small on a carrier 11 due to the configuration of the contact 1. This improves efficiency of punching, gilding, and assembling of the contacts. Since the carrier 11 is connected with the soldering section 23', only the clamps 31' and the palms 32' are immerged in the electrolyte during gilding and this can save aurum.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A contact for a socket connector, comprising:

a base having a body section adapted for being secured in a socket connector housing, the body section defining a rectangular window dividing the body section into an upper portion and a lower portion, an engaging portion extending outwardly obliquely from a lower edge of the upper portion; and a pair of arm sections extending upwardly from opposite lateral sides of the body section in a direction opposite to the engaging portion, the arm sections having a pair of respective planar clamps at upper ends thereof and a pair of respective palms extending from the planar clamps and away from each other;

wherein the palms of the arm sections extend beyond the lower portion of the body section of the base;

wherein the base comprises a linking section extending downwardly from a bottom edge of the body section;

wherein the base comprises a soldering section extending perpendicularly from a bottom edge of the linking section opposite to the engaging portion.

* * * * *